United States Patent
Wu (10) Patent No.: US 12,218,183 B2
(45) Date of Patent: Feb. 4, 2025

(54) METHOD FOR MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Yulei Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 492 days.

(21) Appl. No.: 17/647,614

(22) Filed: Jan. 11, 2022

(65) Prior Publication Data

US 2023/0006032 A1 Jan. 5, 2023

Related U.S. Application Data

(63) Continuation of application No. PCT/CN2021/106440, filed on Jul. 15, 2021.

(30) Foreign Application Priority Data

Jul. 2, 2021 (CN) .......................... 202110753737.0

(51) Int. Cl.
H10B 12/00 (2023.01)
H01L 49/02 (2006.01)

(52) U.S. Cl.
CPC .............. *H01L 28/75* (2013.01); *H01L 28/91* (2013.01); *H10B 12/033* (2023.02); *H10B 12/315* (2023.02); *H10B 12/318* (2023.02)

(58) Field of Classification Search
CPC .. H10B 12/033; H10B 12/315; H10B 12/318; H01L 28/90–92; H01L 21/7682; H01L 21/764
See application file for complete search history.

(56) References Cited

U.S. PATENT DOCUMENTS 6,924,193 B2 8/2005 Lin et al.
9,349,736 B2 5/2016 Hung et al.
(Continued)

FOREIGN PATENT DOCUMENTS

| CN | 104716019 A | 6/2015 |
| CN | 108511424 A | 9/2018 |
| CN | 110970401 A | 4/2020 |

OTHER PUBLICATIONS

International Search Report cited in PCT/CN2021/106440 mailed Mar. 29, 2022, 8 pages.

*Primary Examiner* — Jose R Diaz
(74) *Attorney, Agent, or Firm* — Syncoda LLC; Feng Ma (57) ABSTRACT

The present disclosure provides a method for manufacturing a semiconductor structure and a semiconductor structure. The method for manufacturing a semiconductor structure includes: forming a plurality of capacitor holes on a substrate, and exposing a part of the substrate on bottoms of the capacitor holes; forming a bottom electrode layer on surfaces of the capacitor holes; forming, on a surface of the bottom electrode layer, a dielectric layer continuously covering the surface of the bottom electrode layer; forming a first top electrode layer to continuously cover a surface of the dielectric layer by a first film forming process; by a second film forming process, forming, in a circumferential direction of the capacitor holes, a second top electrode layer continuously covering a surface of the first top electrode layer, and forming, in an axial direction of the capacitor holes.

12 Claims, 10 Drawing Sheets

(56) References Cited

U.S. PATENT DOCUMENTS

2004/0051131 A1 3/2004 Miyajima
2011/0204427 A1 8/2011 Choi et al.
2020/0194436 A1* 6/2020 Kim ..................... H10B 12/315

* cited by examiner

METHOD FOR MANUFACTURING SEMICONDUCTOR STRUCTURE AND SEMICONDUCTOR STRUCTURE

CROSS-REFERENCE TO RELATED APPLICATIONS

This is a continuation of International Application No. PCT/CN2021/106440, filed on Jul. 15, 2021, which claims the priority to Chinese Patent Application No. 202110753737.0, titled "METHOD FOR MANUFACTURING SEMICONDUCTOR STRUCTURE AND SEMICONDUCTOR STRUCTURE" and filed on Jul. 2, 2021. The entire contents of International Application No. PCT/CN2021/106440 and Chinese Patent Application No. 202110753737.0 are incorporated herein by reference.

TECHNICAL FIELD

The present disclosure relates to, but not limited to, a method for manufacturing a semiconductor structure and a semiconductor structure.

BACKGROUND

Dynamic random access memories (DRAMs) are small in size, high in integration, low in power consumption, and faster than all read only memories (ROMs). With the improvement of integration and the continuous reduction of the characteristic size and polar plate area of capacitors, dielectric materials with smaller thickness and/or high dielectric constants must be used to improve the capacitance density. With the gradual size reduction of DRAMs, it is necessary to further ensure that the capacitors can have an enough low leakage current while ensuring an enough high capacitance.

SUMMARY

The following is the summary of the subject described in detail in the present disclosure. This summary is not intended to limit the protection scope defined by the claims.

The present disclosure provides a method for manufacturing a semiconductor structure and a semiconductor structure.

A first aspect of the present disclosure provides a method for manufacturing a semiconductor structure, comprising:
forming a plurality of capacitor holes on a substrate, and exposing a part of the substrate on bottoms of the capacitor holes;
forming a bottom electrode layer on surfaces of the capacitor holes;
forming, on a surface of the bottom electrode layer, a dielectric layer continuously covering the surface of the bottom electrode layer;
continuously covering a surface of the dielectric layer by a first film forming process to form a first top electrode layer; and
by a second film forming process, forming, in a circumferential direction of the capacitor holes, a second top electrode layer continuously covering a surface of the first top electrode layer, and forming, in an axial direction of the capacitor holes, the second top electrode layer discontinuously covering the surface of the first top electrode layer.

A second aspect of the present disclosure provides a semiconductor structure, comprising:
a substrate;
a plurality of capacitor holes, the plurality of capacitor holes being formed on the substrate;
a bottom electrode layer, the bottom electrode layer covering surfaces of the capacitor holes;
a dielectric layer, the dielectric layer continuously covering a surface of the bottom electrode layer;
a first top electrode layer, the first top electrode layer continuously covering a surface of the dielectric layer; and
a second top electrode layer, the second top electrode layer continuously covering a surface of the first top electrode layer in a circumferential direction of the capacitor holes and discontinuously covering the surface of the first top electrode layer in an axial direction of the capacitor holes.

Other aspects will become apparent upon reading and understanding the drawings and detailed description.

BRIEF DESCRIPTION OF THE DRAWINGS

The drawings incorporated into the specification and constituting a part of the specification show the embodiments of the present disclosure, and are used with the description to explain the principles of the embodiments of the present disclosure. Throughout the drawings, like reference numerals denote like elements. The drawings to be described hereinafter are some but not all of the embodiments of the present disclosure. Those skilled in the art can obtain other drawings according to these drawings without paying any creative effort.

DETAILED DESCRIPTION

The technical solutions in the embodiments of the present disclosure will be described clearly and completely with reference to the drawings in the embodiments of the present disclosure. Apparently, the embodiments to be described are only some but not all of the embodiments of the present disclosure. All other embodiments obtained on the basis of the embodiments in the present disclosure by those skilled in the art without paying any creative effort shall fall into the protection scope of the present disclosure. It is to be noted that the embodiments of the present disclosure and the features in the embodiments can be arbitrarily combined with each other if not conflicted.

The method for manufacturing a semiconductor structure and a semiconductor structure will be described in detail below with reference to FIGS. 1-16.

Figure 1:
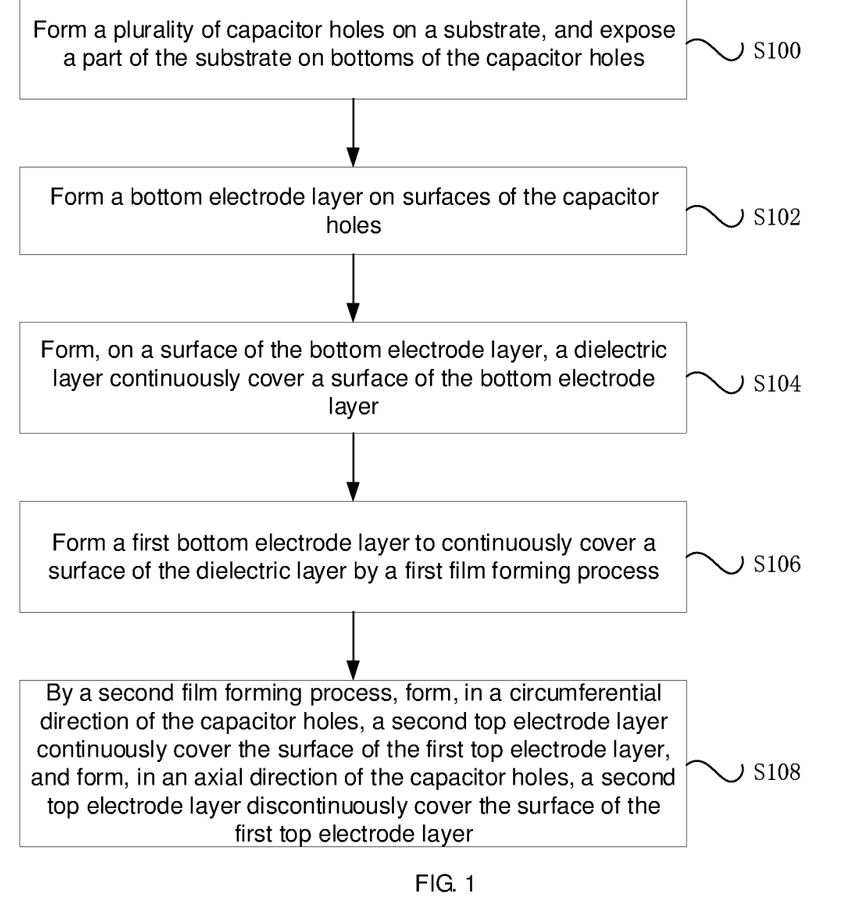
FIG. 1 is a flowchart of a method for manufacturing a semiconductor structure according to an exemplary embodiment.

As shown in FIG. 1, the method for manufacturing a semiconductor structure according to an embodiment of the present disclosure comprises the following steps.

S100: A plurality of capacitor holes are formed on a substrate, and a part of the substrate is exposed on bottoms of the capacitor holes.

Figure 2:
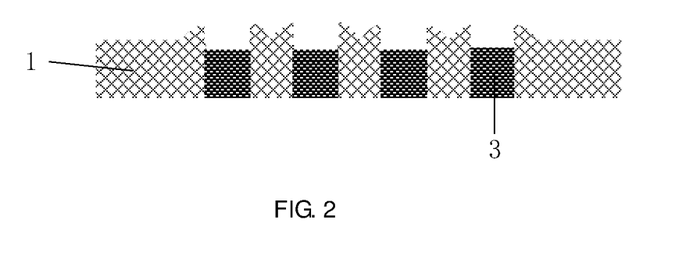
FIG. 2 is a schematic structure diagram of the semiconductor structure after a stacked structure is formed on a substrate according to an exemplary embodiment.
Figure 3:
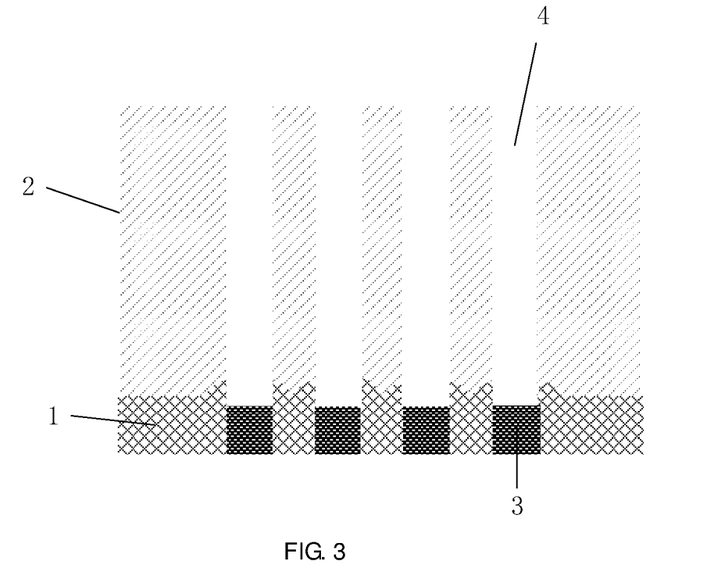
FIG. 3 is a schematic structure diagram of the method for manufacturing a semiconductor structure after the step S100 according to an exemplary embodiment.

In this embodiment, as shown in FIG. 2, a substrate 1 is provided. The material of the substrate 1 may be monocrystalline silicon, polycrystalline silicon, amorphous silicon, silicon germanium compound or silicon on insulator, etc. In this embodiment, the material of the substrate 1 is silicon nitride. In addition, the substrate 1 may further comprise transistor wordlines, bitlines, etc. Semiconductor structures (not shown) such as shallow trench isolation structures and doped regions may also be formed in the substrate 1. This disclosure is not limited In this embodiment, a plurality of metal structures 3 are embedded in the substrate 1. The plurality of metal structures 3 are arrange at intervals in the substrate 1, and the metal structures 3 are arranged corresponding to the capacitor holes 4. That is, the number of the metal structures 3 is consistent with the number of the capacitor holes 4. As shown in FIG. 3, the capacitor holes 4 are arranged opposite to the metal structures 3, and the longitudinal section widths of the capacitor holes 4 are consistent with the longitudinal section widths of the metal structures 3. For example, a patterned first mask layer (not shown) can be formed on the substrate 1, and the patterned first mask layer has a plurality of first opening patterns. Each first opening faces one metal structure 3, and the longitudinal section width of each first opening is the same as the longitudinal section width of the metal structure 3. The substrate 1 is etched by using the patterned first mask layer as a mask to expose the top surfaces of the metal structures 3. Each capacitor hole 4 extends into the substrate 1 through the stacked structure 2, so as to expose all the top surfaces of the metal structures 3 and a part of the surface of the substrate 1 located around the metal structures 3.

The first mask layer may be a polycrystalline silicon mask layer, and the patterned first mask layer is formed by lithography.

In this embodiment, as shown in FIG. 2, the top surfaces of the metal structures 3 are not in the same plane as the top surface of the substrate 1. For example, the top surfaces of the metal structures 3 are lower than a part of the top surface of a main body of the substrate 1, or the top surfaces of the metal structures 3 are lower than a part of the top surface of the substrate 1 near the peripheries of the metal structures 3. The shape of the longitudinal sections of the metal structures 3 comprises, but not limited to, rectangular structures.

In this embodiment, as shown in FIG. 3, a stacked structure 2 is provided on the substrate 1. The stacked structure 2 can be successively formed on the substrate 1 and the top surfaces of the metal structures 3 by chemical vapor deposition (CVD) or atomic layer deposition (ALD), etc. The stacked structure 2 can be a structure comprising only functional layers for realizing auxiliary functions, i.e., sacrificial layers, or sacrificial layers for realizing auxiliary functions and support layers for realizing supporting which are stacked successively. That is, the support layers and the sacrificial layers are stacked alternately. The sacrificial layers can be made of silicon oxide or other materials. A photoresist is coated on the upper surfaces of the sacrificial layers to form photoresist patterns (not shown). The photoresist patterns are configured to etch the stacked structure 2 to form a plurality of capacitor holes 4.

S102: A bottom electrode layer is formed on surfaces of the capacitor holes.

Figure 4:
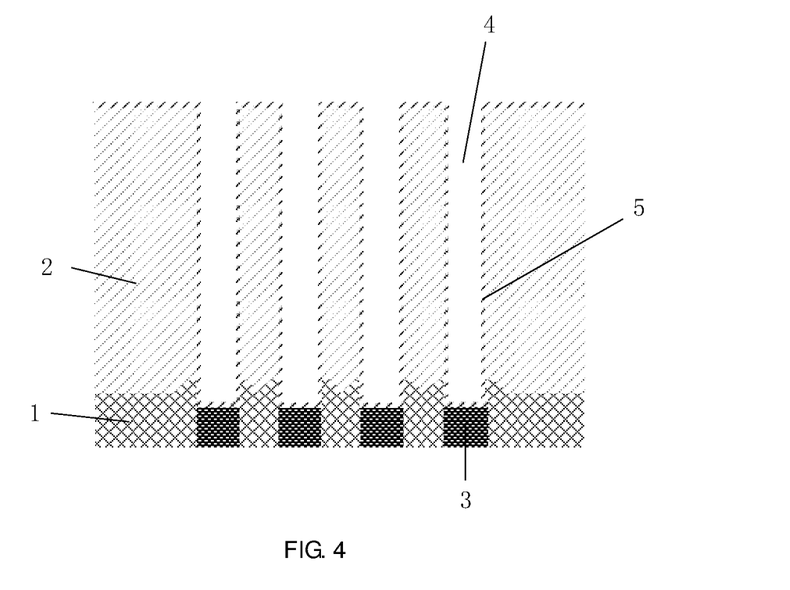
FIG. 4 is a schematic structure diagram of the method for manufacturing a semiconductor structure after the step S102 according to an exemplary embodiment.

In this embodiment, as shown in FIG. 4, the bottom electrode layer 5 can be formed on the surfaces of the capacitor holes 4 by chemical vapor deposition, physical vapor deposition or atomic layer deposition, etc. The bottom electrode layer 5 covers the top surface of the stacked structure 2, and also covers the inner wall surfaces of the capacitor holes and the top surfaces of the metal structures 3. The bottom surface of the bottom electrode layer 5 comes into contact with the top surfaces of the metal structures 3, so that electrical connections are formed between the bottom electrode layer 5 and the metal structures 3. Meanwhile, the outer sidewall on the bottom of the bottom electrode layer 5 is in contact with a part of the surface of the substrate 1. The substrate 1 supports the bottom electrode layer 5, so that the stability of the bottom electrode layer 5 is improved.

In this embodiment, after the bottom electrode layer is formed on the surfaces of the capacitor holes in the step S102 and before a dielectric layer is formed, the method further comprises:

selectively etching the stacked structure to form a plurality of openings exposing the sacrificial layers; and removing the sacrificial layers in the stacked structure along the openings, and form first gaps between the capacitor holes, the first gaps exposing the other one surface of the bottom electrode layer.

Figure 5:
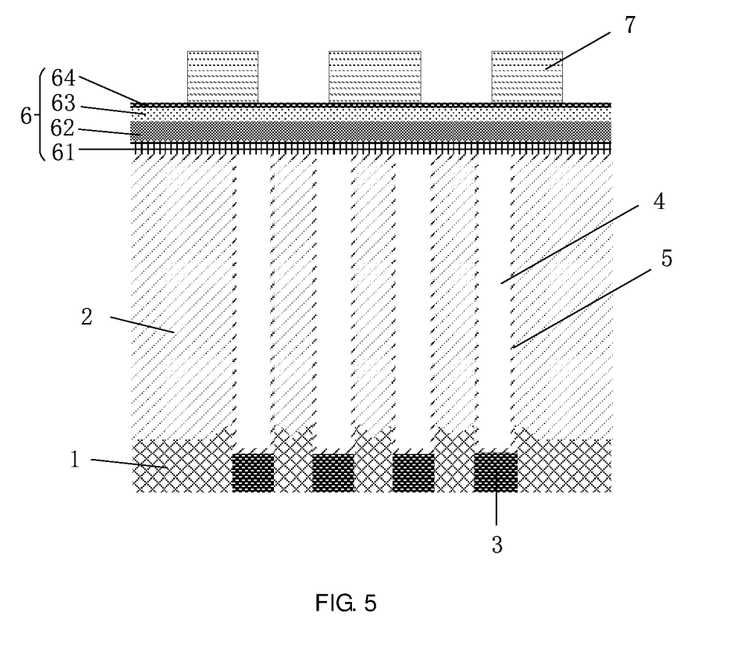
FIG. 5 is a schematic structure diagram of the method for manufacturing a semiconductor structure after a block layer is formed in the step S102 according to an exemplary embodiment.
Figure 6:
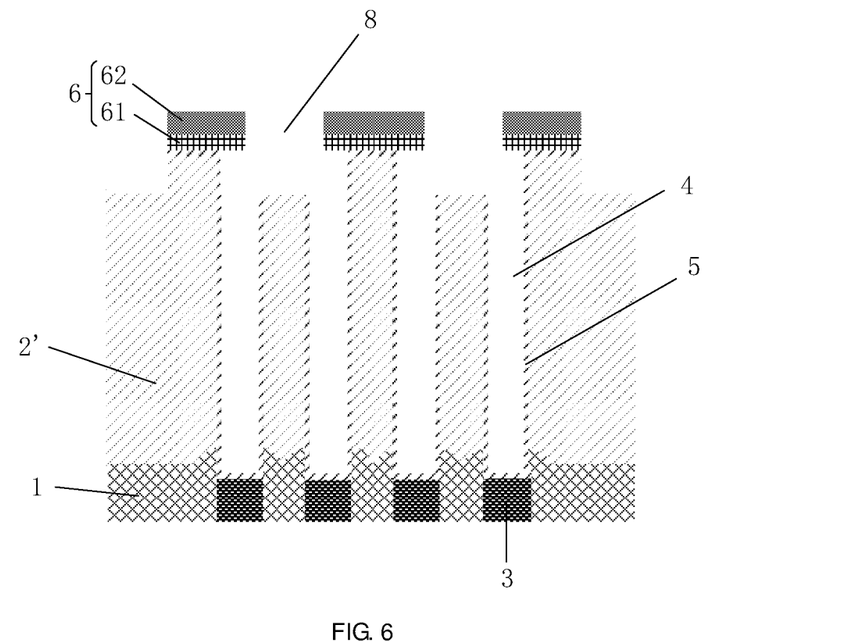
FIG. 6 is a schematic structure diagram of the method for manufacturing a semiconductor structure after the stacked structure is selectively etched in the step S102 according to an exemplary embodiment.
Figure 7:
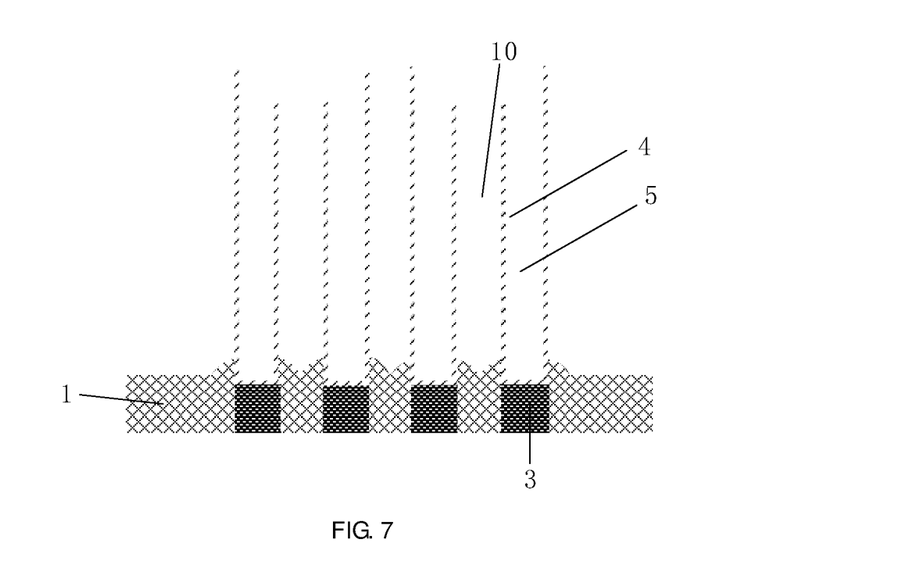
FIG. 7 is a schematic structure diagram of the method for manufacturing a semiconductor structure after sacrificial layers in the stacked structure are removed in the step S102 according to an exemplary embodiment.

As shown in FIGS. 5-6, a block layer 6 is formed above the stacked structure 2. The block layer 6 may comprise multiple layers of dielectric materials. Exemplarily, the block layer 6 comprises a silicon nitride layer 61, a silicon oxide layer 62, a carbon layer 63 and a silicon oxynitride layer 64. A patterned second mask layer 7 can be formed on the block layer 6 by lithography. The patterned second mask layer 7 has an opening pattern. The block layer 6 is etched based on the opening pattern to form a plurality of openings 8. Each opening 8 exposes a part of the surface of the bottom electrode layer 5 on the upper surfaces of the sacrificial layers, so that the exposed part of the bottom electrode layer 5 is removed to expose parts of the surfaces of the sacrificial layers and the sacrificial layers are removed. As shown in FIG. 7, the bottom electrode layer 5 is located on the surfaces of the capacitor holes 4. After the sacrificial layers are removed, a part of the upper surface of the substrate 1 is exposed, and the bottom electrode layer 5 of a cup-shaped structure is formed on the substrate 1. Meanwhile, the other one surface of the bottom electrode layer 5 (i.e., the outer wall surfaces of the bottom electrode layer 5) is exposed. First gaps 10 are formed two adjacent capacitor holes 4, that is, first gaps 10 are formed between outer wall surfaces of the bottom electrode layer 5 between two adjacent capacitor holes.

In this embodiment, the sacrificial layers can be removed by a wet etching process, and the bottom electrode layer 5 can be etched by a dry etching process.

S104: A dielectric layer continuously covering a surface of the bottom electrode layer is formed on the surface of the bottom electrode layer.

Figure 8:
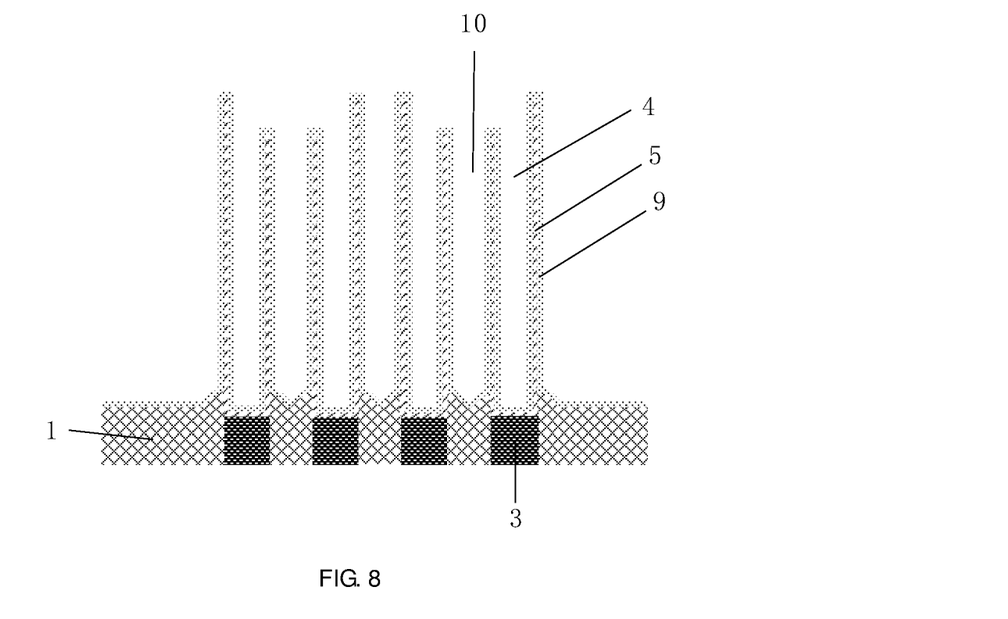
FIG. 8 is a schematic structure diagram of the method for manufacturing a semiconductor structure after the step S104 according to an exemplary embodiment.

In this embodiment, as shown in FIG. 8, the dielectric layer 9 continuously covers all exposed surfaces of the bottom electrode layer 5, that is, the dielectric layer 9 is formed on inner and outer surfaces of the bottom electrode layer 5 in the capacitor holes 4, and the dielectric layer 9 also covers a part of the upper surface of the substrate 1. Continuously covering can be interpreted as the dielectric layer 9 covering the bottom electrode layer 5 being continuous. For example, the dielectric layer in the capacitor holes 4 is connected together, or the dielectric layer 9 in the plurality of capacitor holes 4 and the dielectric layer 9 between the capacitor holes 4 are connected to each other.

The material of the dielectric layer 9 may be a high-K dielectric material to improve the capacitance value of the semiconductor structure. For example, the dielectric layer is a stacked layer formed from any one or more than two selected from a group consisting of ZrOx, HfOx, ZrTiOx, RuOx, SbOx and AlOx.

S106: A first top electrode layer is formed to continuously cover a surface of the dielectric layer by a first film forming process.

Figure 9:
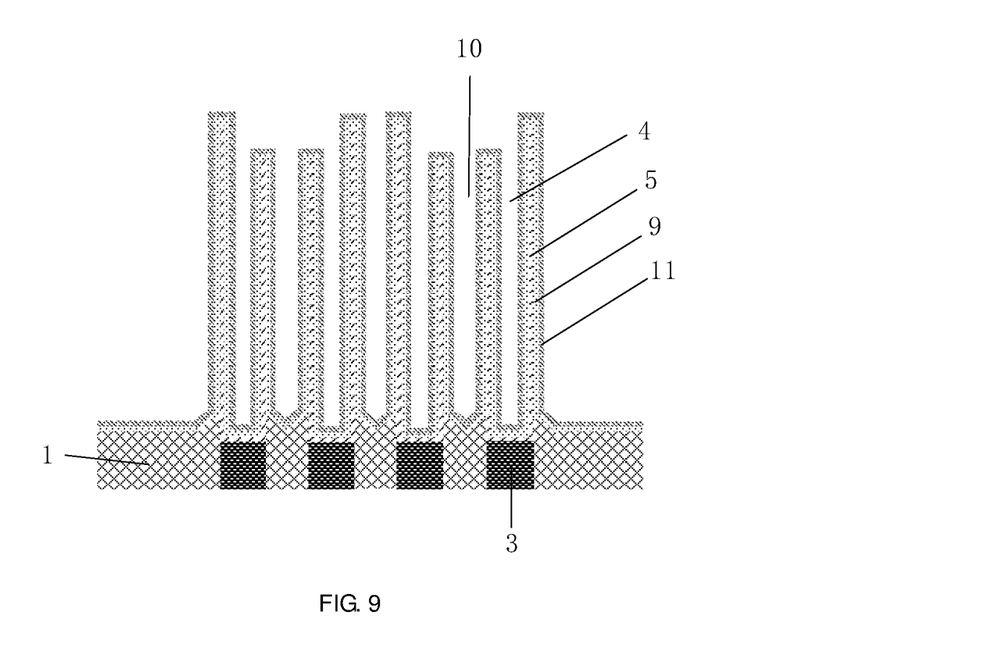
FIG. 9 is a schematic structure diagram of the method for manufacturing a semiconductor structure after the step S106 according to an exemplary embodiment.

In this embodiment, as shown in FIG. 9, a first top electrode layer 11 covering the outer surface of the dielectric layer 9 is formed by the first film forming process.

As shown in FIG. 9, the first top electrode layer 11 can be deposited on the surface of the dielectric layer 9 by atomic layer CVD (ALCVD), and a conductive material (e.g., TiN) can also be added in the first top electrode layer 11. Boron-doped SiGe in the first top electrode layer 11 can be replaced with TiN, so that the penetration of boron into the high dielectric material (dielectric layer 9) can be reduced and the occurrence of electric leakage can be prevented. The precursor used for the growth of the TiN layer is generally $TiCl_4$ or other metal compounds reacted with ammonia gas, and the growth temperature is controlled within 500° C.

In this embodiment, the first film forming process can include a first deposition rate. Exemplarily, the first deposition rate can be controlled within 1 nm/min, so that the first top electrode layer 11 is formed on the dielectric layer 9 by a slow growth process. Thus, the defect state of the dielectric layer 9 and the first top electrode layer 11 is effectively reduced, electric leakage is reduced, and the reliability of the semiconductor structure is improved. The thickness of the first top electrode layer 11 is also controlled within a certain range by the first film forming process. For example, the thickness of the first top electrode layer 11 is controlled to be about 5 nm.

S108: By a second film forming process, a second top electrode layer continuously covering the surface of the first top electrode layer is formed in a circumferential direction of the capacitor holes, and the second top electrode layer discontinuously covering the surface of the first top electrode layer is formed in an axial direction of the capacitor holes.

Figure 10:
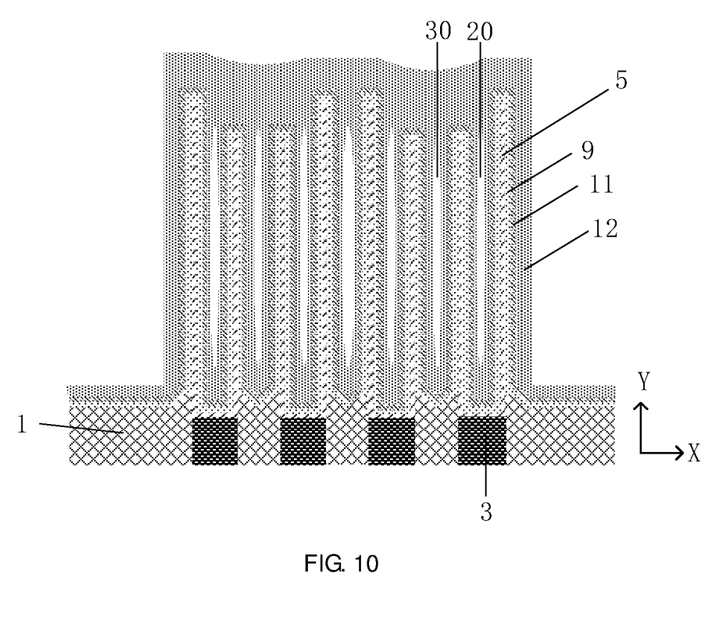
FIG. 10 is a schematic structure diagram of the method for manufacturing a semiconductor structure after the step S108 according to an exemplary embodiment.

In this embodiment, as shown in FIGS. 9-10, the surface of the first top electrode layer 11 is continuously covered by a second film forming process, and form a second top electrode layer 12 that is, the second top electrode layer 12 is located on the surface of the first top electrode layer 11 on the inner wall surfaces of the capacitor holes 4, and also located on the surface of the first top electrode layer on the outer wall surfaces opposite to the inner wall surfaces of the capacitor holes. Meanwhile, the section (cross section) of a part of the second top electrode layer 12 located in the capacitor holes 4 in a first direction and the section (longitudinal section) thereof in a second direction are discontinuous. That is, the second top electrode layer 12 forms first air gaps 20 in the capacitor holes 4, and the first air gaps 20 disconnects a part of the second top electrode layer 12, so that the possibility of electric leakage of the semiconductor structure is reduced. As shown in FIG. 9, the direction indicated by arrow X is the first direction of the section of the second top electrode layer 12 in the capacitor holes, that is, a direction perpendicular to the longitudinal central axis of the capacitor holes; and, the direction indicated by arrow Y is the second direction of the section of the second top electrode layer 12 in the capacitor holes 4, i.e., a direction parallel to the longitudinal central axis of the capacitor holes.

In this embodiment, the second top electrode layer 12 can be deposited by physical vapor deposition (PVD) or chemical vapor deposition (CVD). When the PVD growth is adopted, the TiN target material is used, and Ar bombardment deposition is adopted; and, when CVD is adopted, $TiCl_4$ or metal organic compounds are used as a precursor for reacting with $NH_3$.

In this embodiment, the second film forming process can include a second deposition rate. When the second top electrode layer 12 is deposited by PVD or CVD, the second deposition rate needs to be greater than the first deposition rate. Exemplarily, the second deposition rate can be controlled to be about 5-10 nm/min. The first air gaps 20 are defined by the second top electrode layer 12. The size and shape of the first air gaps 20 formed in the capacitor holes 4 can be adjusted by adjusting the second deposition rate.

In this embodiment, the method for manufacturing a semiconductor structure comprises: by a second film forming process, forming, in a circumferential direction of the first gaps, a second top electrode layer continuously covering the surface of the first top electrode layer, and forming, in an axial direction of the first gaps, a second top electrode layer discontinuously covering the surface of the first top electrode layer.

As shown in FIGS. 9-10, by the second film forming process, the second top electrode layer 12 can continuously covers the surface of the first top electrode layer 11 on the inner wall surfaces of the first gaps 10 between the capacitor holes 4. The second top electrode layer 12 on the inner wall surfaces of the first gaps 10 is connected together, and the second top electrode layer 12 on the inner wall surfaces of the first gaps 10 and the second top electrode layer 12 on the inner wall surfaces of the capacitor holes 4 are connected to each other. That is, the second top electrode layer 12 on the inner wall surfaces of the first gaps 10 is connected to the outer wall surface of the second top electrode layer 12. The section of the second top electrode layer 12 formed in the first gaps 10 in the first direction and the section thereof in the second direction are discontinuous. That is, the second top electrode layer 12 forms second air gaps 30 in the first gaps 10, and the second air gaps 30 disconnects a part of the second top electrode layer 12, so that the electric leakage of the semiconductor structure is improved.

In this embodiment, after the second top layer is formed in the step S108, the method further comprises performing annealing.

The residual impurities in the first top electrode layer 11 and the second top electrode layer 12 are removed by a fast annealing process. The adhesion between the dielectric layer 9 and the first top electrode layer 11 of the capacitor is improved by the fast annealing process.

In this embodiment, after the second top electrode layer is formed, the method further comprises: forming a third top electrode layer on the surface of the second top electrode layer, the material of the third top electrode layer being the same as or different from the material of the second top electrode layer.

Figure 11:
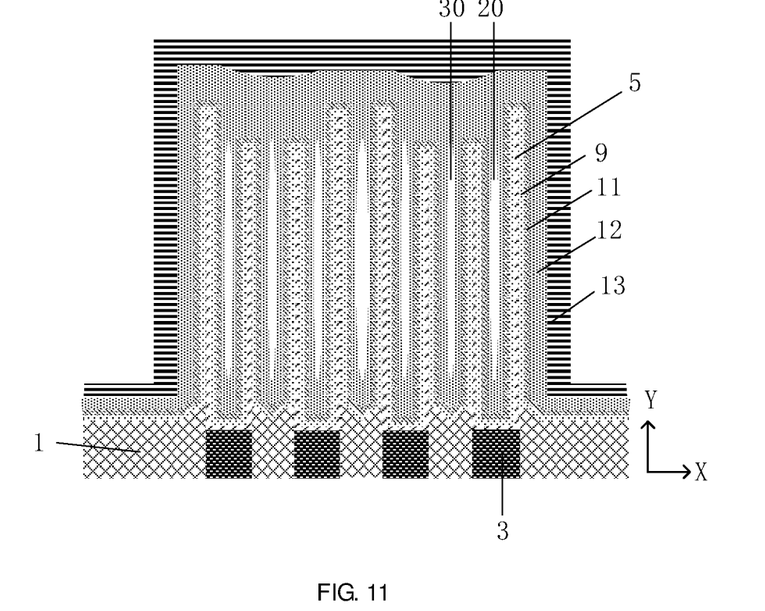
FIG. 11 is a schematic structure diagram of the method for manufacturing a semiconductor structure after a third top electrode layer is formed in the step S108 according to an exemplary embodiment.

As shown in FIG. 11, after the semiconductor structure is annealed rapidly, in order to improve the electrical conductivity of the capacitor in the semiconductor structure, a third top electrode layer 13 covering the outer surface of the second top electrode layer 12 can be formed by chemical vapor deposition, physical vapor deposition or atomic layer deposition, wherein the material for preparing the third top electrode layer 13 comprises polycrystalline silicon, metal or other conductive materials, for example, tungsten, etc.

In this embodiment, the stacked structure further comprises support layers. That is, the stacked structure is a laminated structure in which support layer and sacrificial layers are stacked alternately. The number M of the support layers in the laminated structure is greater than or equal to the number N of the sacrificial layers to be removed subsequently. That is, M is greater than N. Moreover, the support layers are arranged above or below the sacrificial layers in the laminated structure. The number of the support layers and the sacrificial layers can be set as required, and is not limited to this specific embodiment.

Figure 12:
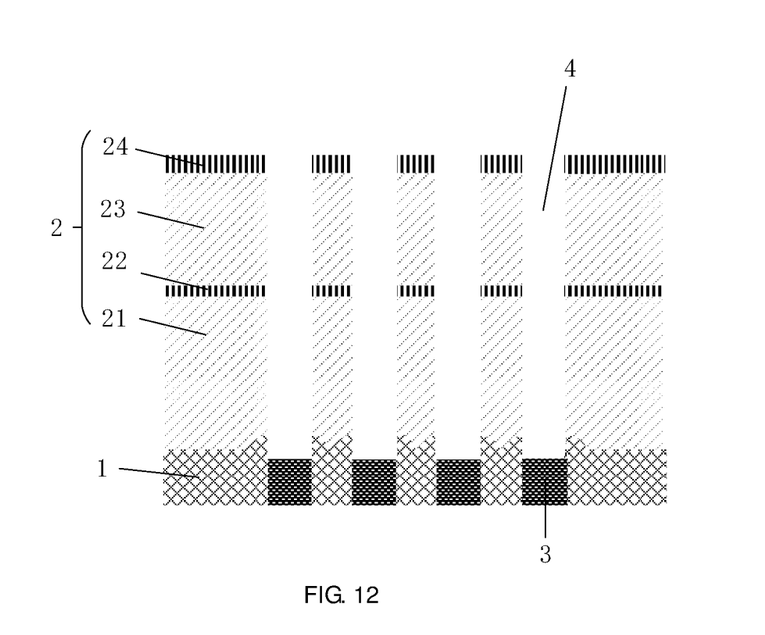
FIG. 12 is a schematic structure diagram after the stacked structure is formed on the substrate according to an exemplary embodiment.

As shown in FIG. 12, the stacked structure 2 is a first sacrificial layer 21, a first support layer 22, a second sacrificial layer 23 and a second support layer 24 which are stacked successively from the bottom up, wherein the material of the first sacrificial layer 21 and the second sacrificial layer 23 can be silicon oxide or other materials, and the material of the first support layer 22 and the second support layer 24 can be silicon nitride, silicon carbonitride or other materials. Under the same etching conditions, the removal rate of the first sacrificial layer 21 and the second sacrificial layer 23 can be different from the removal rate of the first support layer 22 and the second support layer 24.

In this embodiment, as shown in FIG. 12, the capacitor holes 4 formed in the stacked structure 2 successively run through the second support layer 24, the second sacrificial layer 23, the first support layer 22 and the first sacrificial layer 21 to extend to the top surfaces of the metal structures 3 in the substrate 1.

Figure 13:
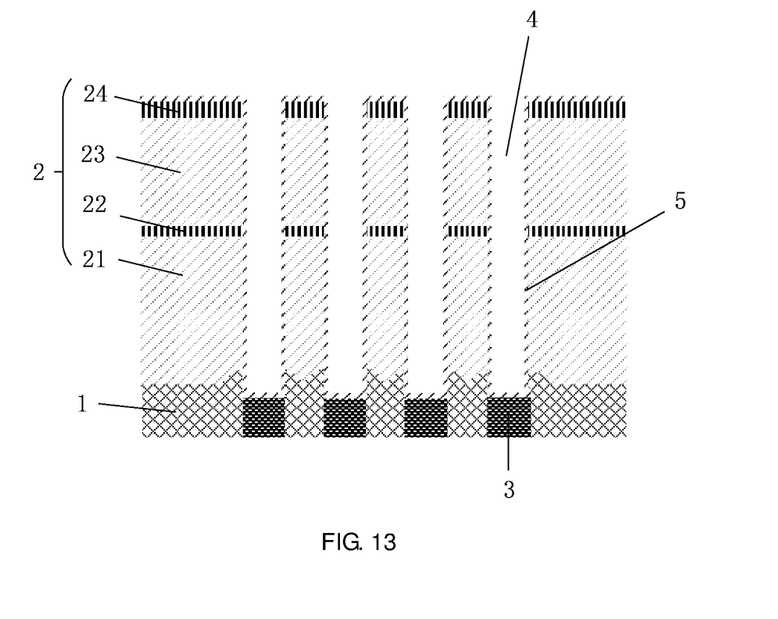
FIG. 13 is a schematic structure diagram of the method for manufacturing a semiconductor structure after the step S100 according to an exemplary embodiment.
Figure 14:
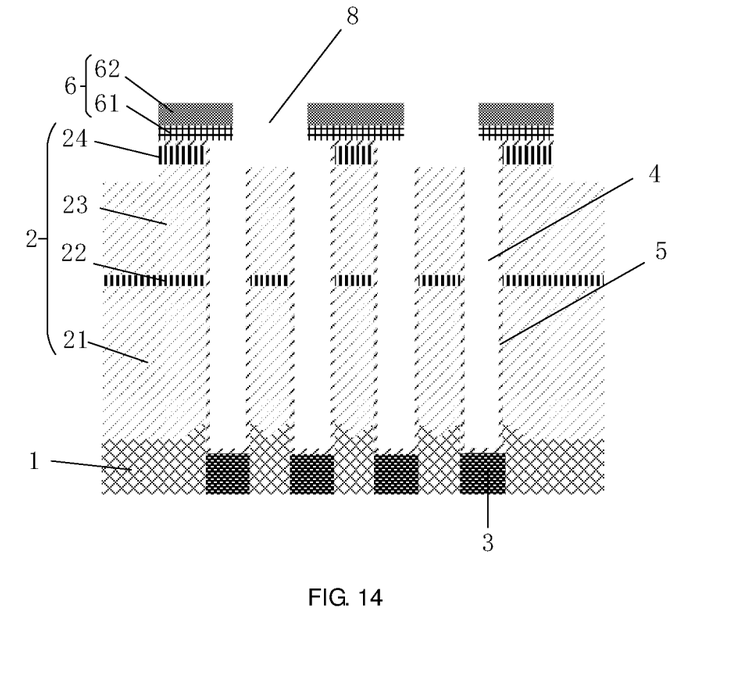
FIG. 14 is a schematic structure diagram of the method for manufacturing a semiconductor structure after the stacked structure is selectively etched in the step S102 according to an exemplary embodiment.

As shown in FIGS. 13-14, during the process of forming the bottom electrode layer 5 on the surfaces of the capacitor holes 4 in the step S102, a part of the bottom electrode layer 5 also covers the upper surface of the second support layer 24. In order to remove all sacrificial layers (i.e., the first sacrificial layer 21 and the second sacrificial layer 23) in the stacked structure 2, it is necessary to selectively etch a part of the bottom electrode layer 5 located on the second support layer 24 and a part of the second support layer 24 to expose the sacrificial layer (i.e., the second sacrificial layer 23) in the stacked structure 2. For example, a block layer 6 can be formed above the bottom electrode layer 5. By using a third mask layer (not shown) formed with an opening pattern, the block layer 6 is etched based on the opening pattern to form openings 8. The openings 8 expose a part of the upper surface of the bottom electrode layer 5 located on the second support layer 24. The bottom electrode layer 5 located on the second support layer 24 and a part of the second support layer 24 in the stacked structure 2 are etched based on the openings 8, to expose a part of the surface of the second sacrificial layer 23 so that all the second sacrificial layer 23 is removed, and expose a part of the surface of the first support layer 22 so etch a part of the first support layer 22, and expose a part of the surface of the first sacrificial layer 21 so that all the first sacrificial layer 21 is removed. As shown in FIG. 14, the bottom electrode layer 5 located on the surfaces of the capacitor holes is formed. The structure of the bottom electrode layer 5 comprises, but not limited to, a cup-shaped structure. The remaining part of the second support layer 24 is in contact connection to the upper portion of the outer wall surface of the bottom electrode layer 5, the remaining part of the first support layer 22 is in contact connection to the middle portion of the outer wall surface of the bottom electrode layer 5, and the second support layer 24 and the first support layer 22 support the upper and middle portions of the bottom electrode layer 5, respectively, so that the stability of the bottom electrode layer is further improved.

In this embodiment, the first sacrificial layer 21 and the second sacrificial layer 23 can be removed by a wet etching process, and the first support layer 22 and the second support layer 24 can be etched by a dry etching process.

Figure 15:
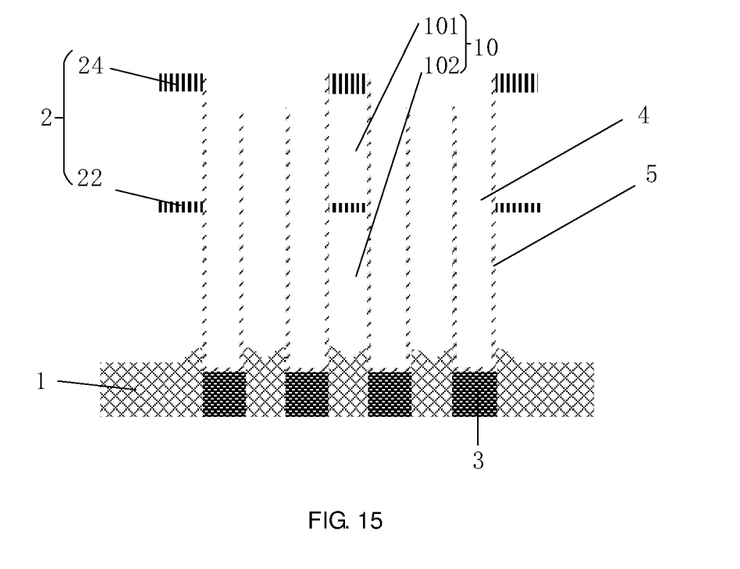
FIG. 15 is a schematic structure diagram of the method for manufacturing a semiconductor structure after sacrificial layers in the stacked structure are removed in the step S102 according to an exemplary embodiment.

In this embodiment, as shown in FIG. 15, after all the sacrificial layers (i.e., the first sacrificial layer and the second sacrificial layer) in the stacked structure 2 are removed, a part of the upper surface of the substrate 1 and the other one surface of the bottom electrode layer 5 (i.e., the outer wall surface of the bottom electrode layer 5) are exposed, and first gaps 10 are formed between two adjacent capacitor holes 4, wherein some of the first gaps 10 are divided into upper gaps 101 and lower gaps 102 by the first support layer 22.

Figure 16:
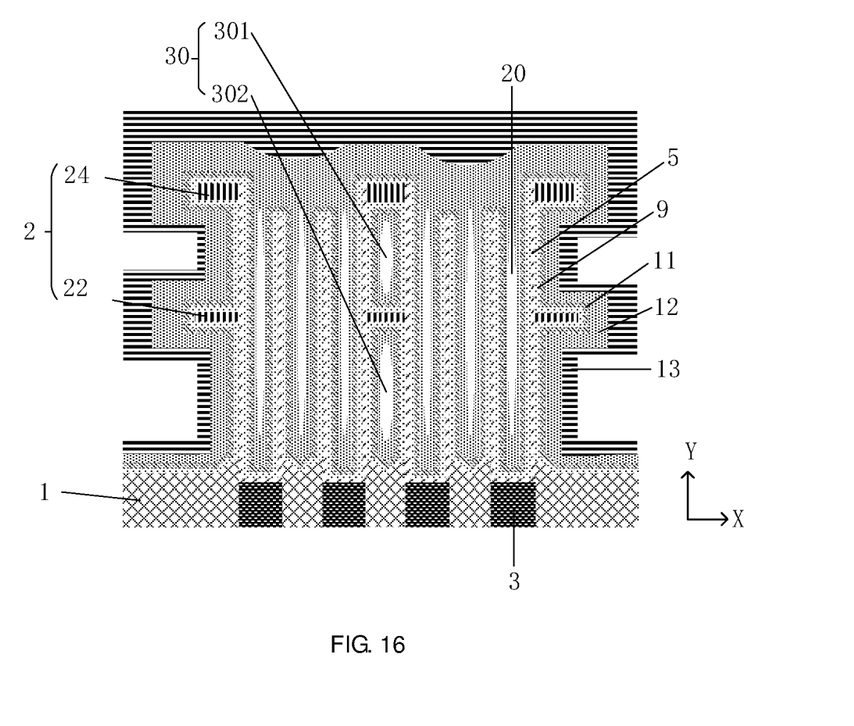
FIG. 16 is a schematic structure diagram of the method for manufacturing a semiconductor structure after a third top electrode layer is formed in the step S108 according to an exemplary embodiment.

In this embodiment, as shown in FIGS. 15-16, when the dielectric layer 9 continuously covering the surface of the bottom electrode layer 5 is formed on the surface of the bottom electrode layer 5 in the step S104, the dielectric layer 9 also covers the second support layer 24, the surface of the first support layer 22 and a part of the surface of the substrate 1.

As shown in FIG. 16, when the second top electrode layer 12 continuously covering the surface of the first top electrode layer 11 is formed on the surface of the first top electrode layer 11 by the second film forming process in the step S108, since some of the first gaps 10 are divided into upper gaps 101 and lower gaps 102 by the first support layer 22, the second air gaps 30 formed by the second top electrode layer 12 in the first gaps 10 are also divided into upper air gaps 301 and lower air gaps 302, wherein the upper air gaps 301 are formed in the second top electrode layer 12 in the upper gaps 101, and the lower air gaps 302 are formed in the second top electrode layer 12 in the lower gaps 102.

The semiconductor structure according to the present disclosure comprises: a substrate, a plurality of capacitor holes, a bottom electrode layer, a dielectric layer, a first top electrode layer and a second top electrode layer.

As shown in FIGS. 3 and 11, a substrate 1, a plurality of metal structures 3 are embedded into the substrate 1, a plurality of capacitor holes 4 are formed on the substrate 1, and the capacitor holes 4 are in one-to-one correspondence to the metal structures 3. The bottom electrode layer 5 covers the surfaces of the capacitor holes 4 and the top surfaces of the metal structures 3, so as to realize the electrical connection to the metal structures 3 of the capacitor. The dielectric layer 9 continuously covers the surface of the bottom electrode layer 5. The first top electrode layer 11 continuously covers the surface of the dielectric layer 9. The second top electrode layer 12 continuously covers the surface of the first top electrode layer 11 in a circumferential direction of the capacitor holes, and also discontinuously covers the surface of the first top electrode layer 11 in an axial direction of the capacitor holes, that is, the second top electrode layer 12 located in the capacitor holes 4 forms first air gaps 20 in the capacitor holes 4. For example, the second top electrode layer 12 forms first air gaps 20 in the middle portions of the capacitor holes 4.

In this embodiment, the second top electrode layer 12 forms first air gaps 20 in the capacitor holes 4, and the first air gaps 20 divide the cross section and longitudinal section of the second top electrode layer 12 formed in the capacitor holes 4 into discontinuous sections, so that the continuity of the second top electrode layer 12 is decreased, the electrical leakage is reduced and the reliability of the semiconductor structure is improved.

In this embodiment, the semiconductor structure further comprises first gaps between the capacitor holes. As shown in FIGS. 7 and 11, the first gaps 10 are located between two adjacent capacitor holes. The second top electrode layer 12 continuously covers the surface of the first top electrode layer 11 in a circumferential direction of the first gaps 10. Meanwhile, the second top electrode layer 12 located in the first gaps 10 forms second air gaps 30 in the first gaps 10. For example, the second top electrode layer 12 forms the second air gaps 30 in the middle portions of the first gaps 10. That is, the second top electrode layer 12 discontinuously covers the surface of the first top electrode layer 11 in an axial direction of the first gaps 10.

In this embodiment, the second top electrode layer 12 forms second air gaps 30 in the first gaps 10 between the capacitor holes 4, and the second air gaps 30 divide the cross section and longitudinal section of the second top electrode layer 12 formed in the first gaps 10 into discontinuous sections, so that the continuity of the second top electrode layer 12 is further decreased, the electrical leakage is reduced and the stability of the semiconductor structure is improved.

In this embodiment, the semiconductor structure further comprises a stacked structure located on the substrate. As shown in FIG. 16, the stacked structure 2 comprises a first support layer 22 and a second support layer 24. Both the first support layer 22 and the second support layer 24 are in contact with the capacitor holes 4. The first support layer 22 is in contact with the middle portion of the outer wall surface of the bottom electrode layer 5 in the capacitor holes 4, and the second support layer 24 is in contact with the upper portion of the outer wall surface of the bottom electrode layer 5 in the capacitor holes 4. The first support layer 22 is located in the middle portions of the capacitor holes 4, and divides some of the first gaps 10 into upper gaps 101 and lower gaps 102. That is, the upper gaps 101 are located between the second support layer 24 and the first support layer 22, and the lower gaps 102 are located between the first support layer 22 and the substrate 1. As shown in FIG. 15, the second air gaps 30 formed by the second top electrode layer 12 in some of the first gaps 10 are divided into upper air gaps 301 and lower air gaps 302 by the first support layer 22. That is, the upper air gaps 301 are located between the second support layer 24 and the first support layer 22, and the lower air gaps 302 are located between the first support layer 22 and the substrate 1.

In this embodiment, in order to improve the electrical conductivity of the electrode layer, as shown in FIG. 16, the semiconductor structure further comprises a third top electrode layer 13. The third top electrode layer 13 covers the surface of the second top electrode layer 12, and the material of the third top electrode layer 13 is the same as or different from the material of the second top electrode layer 12. For example, the material of the third top electrode layer 13 is tungsten and the material of the second top electrode layer is titanium nitride, or the material of both the second top electrode layer 12 and the third top electrode layer is titanium nitride.

Various embodiments or implementations in this specification have been described progressively, and each embodiment focuses on the differences from other embodiments, so the same and similar parts of the embodiments may refer to each other.

In the description of this specification, the description with reference to terms "an embodiment", "an exemplary embodiment", "some embodiments", "an illustrative implementation" or "an example" means that specific features, structures, materials or characteristics described with reference to an implementation or example are included in at least one implementation or example of the present disclosure.

In this specification, the schematic expressions of the terms do not necessarily refer to the same implementation or example. In addition, the described specific features, structures, materials or characteristics may be combined in any one or more implementations or examples in a proper way.

In the description of the present disclosure, it should be understood that the orientation or position relationship indicated by terms such as "center", "upper", "lower", "left", "right", "vertical", "horizontal", "inner" or "outer" is an orientation or position relationship illustrated on the basis of the drawings, and is only for describing the present disclosure and simplifying the description, rather than indicating or implying that the specified device or element must have a particular direction and be constructed and operated in a particular direction. Therefore, the terms cannot be interpreted as limitations to the present disclosure.

It should be understood that the terms such as "first" and "second" used in the present disclosure can be used in the present disclosure to describe various structures, but these structures are not limited by these terms. The terms are only used to distinguish a first structure from another structure.

Throughout one or more drawings, the same elements are denoted by similar reference numerals. For clarity, many parts in the drawings are drawn to scale. In addition, some known parts may not be shown. For simplicity, the structures obtained after several steps can be described in one drawing. Many specific details of the present disclosure are described hereinafter, for example, the structures, materials, sizes, processing processes and technologies of the devices, in order to understand the present disclosure more clearly. As will be understood by those skilled in the art, the present disclosure may be implemented without these specific details.

Finally, it is to be noted that the foregoing embodiments are only used for describing the technical solutions of the present disclosure, rather than limiting the present disclosure. Although the present disclosure has been described in detail by the foregoing embodiments, a person of ordinary skill in the art should understood that modifications can still be made to the technical solutions recorded in the foregoing embodiments or equipment replacements can be made to some or all of the technical features, and these modifications or replacements do not make the essence of the corresponding technical solutions depart from the scope of the technical solutions in the embodiments of the present disclosure.

Industrial Applicability

In the method for manufacturing a semiconductor structure and a semiconductor structure according to the embodiments of the present disclosure, by dividing the cross section and longitudinal section of the second top electrode layer formed in the capacitor holes into discontinuous sections, the continuity of the second top electrode layer is decreased, and the electrical leakage of the capacitor in the semiconductor structure is reduced.

The invention claimed is:

1. A method for manufacturing a semiconductor structure, comprising:
    forming a plurality of capacitor holes on a substrate, and exposing a part of the substrate on bottoms of the capacitor holes;
    forming a bottom electrode layer on surfaces of the capacitor holes;
    forming a dielectric layer continuously covering a surface of the bottom electrode layer;
    forming a first top electrode layer to continuously cover a surface of the dielectric layer by a first film forming process, a material of the first top electrode layer comprises TiN; and
    by a second film forming process, forming, in a circumferential direction of the capacitor holes, a second top electrode layer continuously covering a surface of the first top electrode layer, and forming, in an axial direction of the capacitor holes, a second top electrode layer discontinuously covering the surface of the first top electrode layer,
    wherein a material of the second top electrode layer comprises TiN, wherein the first film forming process comprises a first deposition rate, the second film forming process comprises a second deposition rate, and the first deposition rate is less than the second deposition rate.

2. The method for manufacturing the semiconductor structure according to claim 1, wherein a stacked structure is provided on the substrate, the stacked structure comprises sacrificial layers, and the capacitor holes are formed on the stacked structure.

3. The method for manufacturing the semiconductor structure according to claim 2, after forming the bottom electrode layer on the surfaces of the capacitor holes and before forming the dielectric layer, further comprising:
    selectively etching the stacked structure to form a plurality of openings exposing the sacrificial layers; and
    removing the sacrificial layers in the stacked structure along the openings, and forming first gaps between the capacitor holes, the first gaps exposing the other one surface of the bottom electrode layer.

4. The method for manufacturing the semiconductor structure according to claim 3, wherein, by the second film forming process, the second top electrode layer continuously covering the surface of the first top electrode layer is formed in a circumferential direction of the first gaps, and the second top electrode layer discontinuously covering the surface of the first top electrode layer is formed in an axial direction of the first gaps.

5. The method for manufacturing the semiconductor structure according to claim 3, wherein the stacked structure further comprises support layers, and the support layers and the sacrificial layers are stacked alternately.

6. The method for manufacturing the semiconductor structure according to claim 1, after forming the second top electrode layer, further comprising:
    forming a third top electrode layer on a surface of the second top electrode layer, a material of the third top electrode layer being the same as or different from the material of the second top electrode layer.

7. The method for manufacturing the semiconductor structure according to claim 1, after forming the second top electrode layer, further comprising: performing annealing.

8. A semiconductor structure, comprising:
    a substrate;
    a plurality of capacitor holes, the plurality of capacitor holes being formed on the substrate;
    a bottom electrode layer, the bottom electrode layer covering surfaces of the capacitor holes;
    a dielectric layer, the dielectric layer continuously covering a surface of the bottom electrode layer;
    a first top electrode layer, the first top electrode layer continuously covering a surface of the dielectric layer; and
    a second top electrode layer, the second top electrode layer continuously covering a surface of the first top electrode layer in a circumferential direction of the capacitor holes and discontinuously covering the surface of the first top electrode layer in an axial direction of the capacitor holes,
    wherein a material of the first top electrode layer comprises TiN, a material of the second top electrode layer comprises TiN, and the first top electrode layer is formed at a deposition rate less than a deposition rate of the second top electrode layer.

9. The semiconductor structure according to claim 8, further comprising first gaps located between the capacitor holes.

10. The semiconductor structure according to claim 9, wherein the second top electrode layer continuously covers the surface of the first top electrode layer in a circumferential direction of the first gaps and discontinuously covers the surface of the first top electrode layer in an axial direction of the first gaps.

11. The semiconductor structure according to claim 8, further comprising a stacked structure located on the substrate, the stacked structure comprising support layers, the support layers being in contact connection to the capacitor holes.

12. The semiconductor structure according to claim 8, further comprising a third top electrode layer, the third top electrode layer covering a surface of the second top electrode layer, a material of the third top electrode layer being the same as or different from the material of the second top electrode layer.

* * * * *